(12) United States Patent
Nishinakama

(10) Patent No.: US 11,361,927 B2
(45) Date of Patent: Jun. 14, 2022

(54) LEVER SWITCH DEVICE

(71) Applicant: Panasonic Intellectual Property Management Co., Ltd., Osaka (JP)

(72) Inventor: Hideki Nishinakama, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 332 days.

(21) Appl. No.: 16/815,247

(22) Filed: Mar. 11, 2020

(65) Prior Publication Data

US 2020/0211805 A1 Jul. 2, 2020

Related U.S. Application Data

(63) Continuation of application No. PCT/JP2018/038390, filed on Oct. 16, 2018.

(30) Foreign Application Priority Data

Dec. 8, 2017 (JP) .............................. JP2017-235935

(51) Int. Cl.
*H01H 3/08* (2006.01)
*H01H 89/00* (2006.01)
(Continued)

(52) U.S. Cl.
CPC .......... *H01H 89/00* (2013.01); *H01H 1/5805* (2013.01); *H01H 3/08* (2013.01);
(Continued)

(58) Field of Classification Search
CPC ............ H01H 3/04; H01H 3/06; H01H 89/00; H01H 1/5805; H01H 3/08; H01H 3/12;
(Continued)

(56) References Cited

U.S. PATENT DOCUMENTS 6,849,815 B2 * 2/2005 Leng .................... B60Q 1/1476
200/61.54
10,014,138 B2 * 7/2018 Ishigure ............... B60Q 1/1469
(Continued)

FOREIGN PATENT DOCUMENTS

JP 2013-168287 8/2013
JP 2016-157616 9/2016

OTHER PUBLICATIONS

International Search Report of PCT application No. PCT/JP2018/038390 dated Jan. 22, 2019.

*Primary Examiner* — Ahmed M Saeed
(74) *Attorney, Agent, or Firm* — Greenblum & Bernstein, P.L.C.

(57) ABSTRACT

A lever switch device includes a shaft member, a rotary operation member, a push switch, and a flexible board. The flexible board has a first board part, a first wiring part connected to the first board part, a second board part, a second wiring part connected to the second board part, and an integrated wiring part. The first board part has a fixed contact. A movable contact of the rotary operation member comes into contact with and separates from the fixed contact in response to a positional shift of the rotary operation member. The second board part receives a signal output from the push switch. The integrated wiring part is at a position away from the first board part and the second board part, and a part of the first wiring part and a part of the second wiring part are integrated in the integrated wiring part.

8 Claims, 11 Drawing Sheets base end side ←→ leading end side

(51) Int. Cl.
*H01H 1/58* (2006.01)
*H01H 3/12* (2006.01)
*H01H 9/02* (2006.01)
*H05K 1/11* (2006.01)

(52) U.S. Cl.
CPC .............. *H01H 3/12* (2013.01); *H01H 9/02* (2013.01); *H05K 1/118* (2013.01); *H01H 2001/5816* (2013.01); *H05K 2201/052* (2013.01); *H05K 2201/09063* (2013.01)

(58) Field of Classification Search
CPC .. H01H 9/02; H01H 2001/5816; H01H 3/125; H01H 13/705; H01H 13/14; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 13/20; H05K 1/118; H05K 2201/052; H05K 2201/09063; B60Q 1/1476; B60Q 1/1469
See application file for complete search history.

(56) References Cited

U.S. PATENT DOCUMENTS

| | | | |
|---|---|---|---|
| 10,096,442 B2* | 10/2018 | Ishigure | B60Q 1/1469 |
| 2012/0097508 A1* | 4/2012 | Son | B60Q 1/1476 |
| | | | 200/18 |
| 2013/0206551 A1 | 8/2013 | Kosaka | |
| 2016/0247643 A1 | 8/2016 | Ishigure et al. | |

* cited by examiner

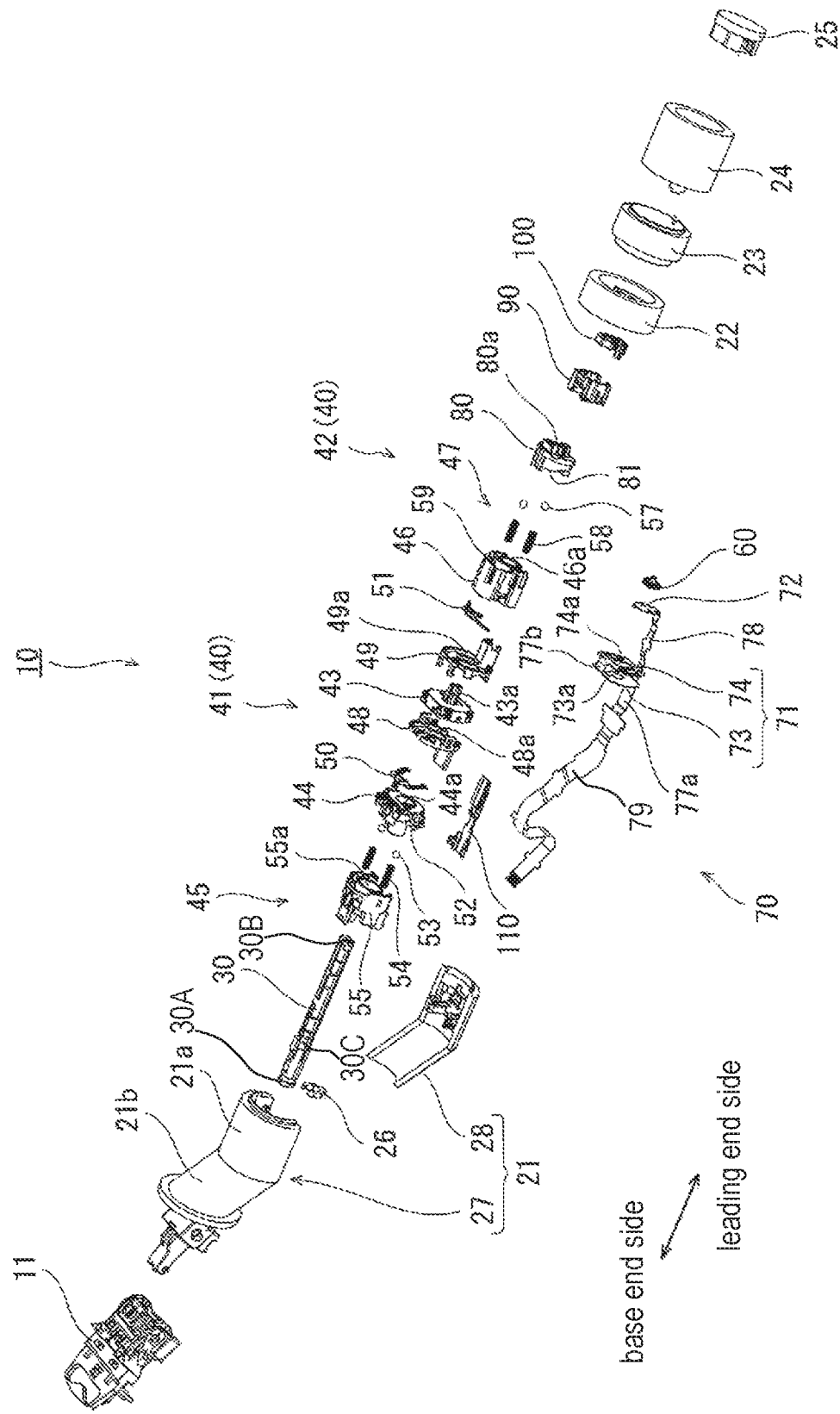

leading end side base end side

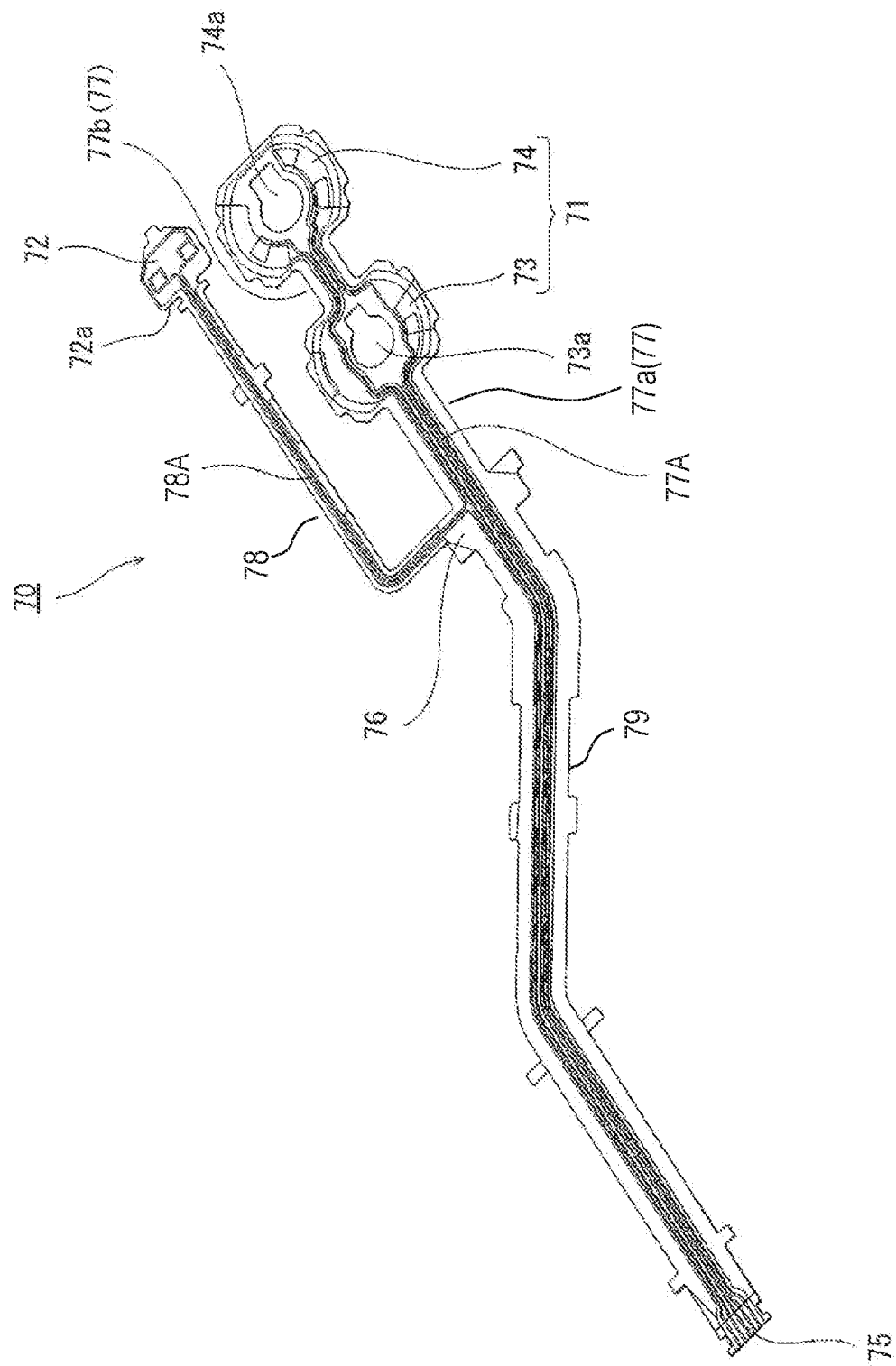

leading end side
↕
base end side

LEVER SWITCH DEVICE

CROSS-REFERENCE TO RELATED APPLICATIONS

This application is a continuation of the PCT International Application No. PCT/JP2018/038390 filed on Oct. 16, 2018, which claims the benefit of foreign priority of Japanese patent applications No. 2017-235935 and No. 2017-235936 both filed on Dec. 8, 2017, the contents all of which are incorporated herein by reference.

BACKGROUND

1. Technical Field

The present disclosure relates to a lever switch device, and more particularly to a lever switch device including a rotary switch and a push switch.

2. Description of the Related Art

For example, Japanese Patent Unexamined Publication No. 2016-157616 discloses a conventional lever switch device. This lever switch device includes a rotor member, a knob member, a movable contact member, and a flexible board. The rotor member and the knob member are mounted rotatable about a longitudinal shaft. The movable contact member is disposed between a cam face of the rotor member and a cam face of the knob member. The movable contact member is disposed in a manner movable in a direction along which the longitudinal shaft extends by rotating the rotor member and the knob member, and has a contact terminal. The flexible board has a contact part that comes into contact with or separates from the contact terminal as the movable contact member moves in the direction along which the longitudinal shaft extends. The flexible board is linearly disposed in the direction along which the longitudinal shaft extends in a movable range of the movable contact member.

SUMMARY

The lever switch device in an aspect of the present disclosure includes a shaft member, a rotary operation member, a push switch, and a flexible board. The shaft member includes a peripheral part, a first end, and a second end; and extends in the axial direction passing through the first end and the second end. The rotary operation member is provided outside the shaft member at a position between the first end and the second end of the shaft member. The rotary operation member is rotatable about the shaft member and has a movable contact. The push switch is attached to the second end of the shaft member. The flexible board includes multiple wirings. The multiple wirings transmit a signal generated in response to a positional shift of the rotary operation member and a signal output from the push switch. These wirings include a first group of wirings and a second group of wirings different from the first group of wirings. The flexible board includes a first board part, a first wiring part, a second board part, a second wiring part, and an integrated wiring part. The first board part has a fixed contact. The movable contact comes into contact with or separates from the fixed contact in response to the positional shift of the rotary operation member. The first wiring part includes the first group of wirings and is connected to the first board part. The second board part receives a signal output from the push switch. The second wiring part includes the second group of wirings and is connected to the second board part. The integrated wiring part is at a position away from the first board part and the second board part, and a part of the first wiring part and a part of the second wiring part are integrated in the integrated wiring part.

In this structure, the movable contact and the rotary operation member rotate together, and thus the structure is simplified. Still more, since the first board connected to the first wiring part and the second board connected to the second wiring part are provided separately, these boards can be bent independently. Accordingly, the structure offers good workability.

The present disclosure offers the lever switch device having the structure described above and good workability

BRIEF DESCRIPTION OF DRAWINGS

FIG. 2A is an exploded perspective view of the lever switch device illustrated in FIG. 1A.

FIG. 5A is a perspective view of a flexible board of the lever switch device illustrated in FIG. 2A.

DETAILED DESCRIPTION OF PREFERRED EMBODIMENTS

In the lever switch device of Japanese Patent Unexamined Publication No. 2016-157616, the movable contact member has a special structure for moving in the direction along which the longitudinal shaft extends according to the rotation of the rotor member and the knob member. Therefore, the structure of the switch device is complicated.

In general, the movable contact member rotates together with the rotor member. Therefore, a board having a contact part that comes into contact with or separates from the contact terminal of the movable contact member is disposed so as to face the movable contact member. Such boards are provided corresponding to the number of rotor members. In addition to the rotor member, a push switch may be installed in the switch device. In this case, when a push switch board and rotor member board are stacked in the structure, it is difficult to hold the boards during work such as bending, resulting in poor workability.

The present disclosure offers a lever switch device with a simple structure and good workability.

An exemplary embodiment of the present disclosure is detailed below with reference to drawings. Same reference marks are given to the same or equivalent components in all drawings to omit duplicate description.

<Structure of Lever Switch Device>

Figure 1A:
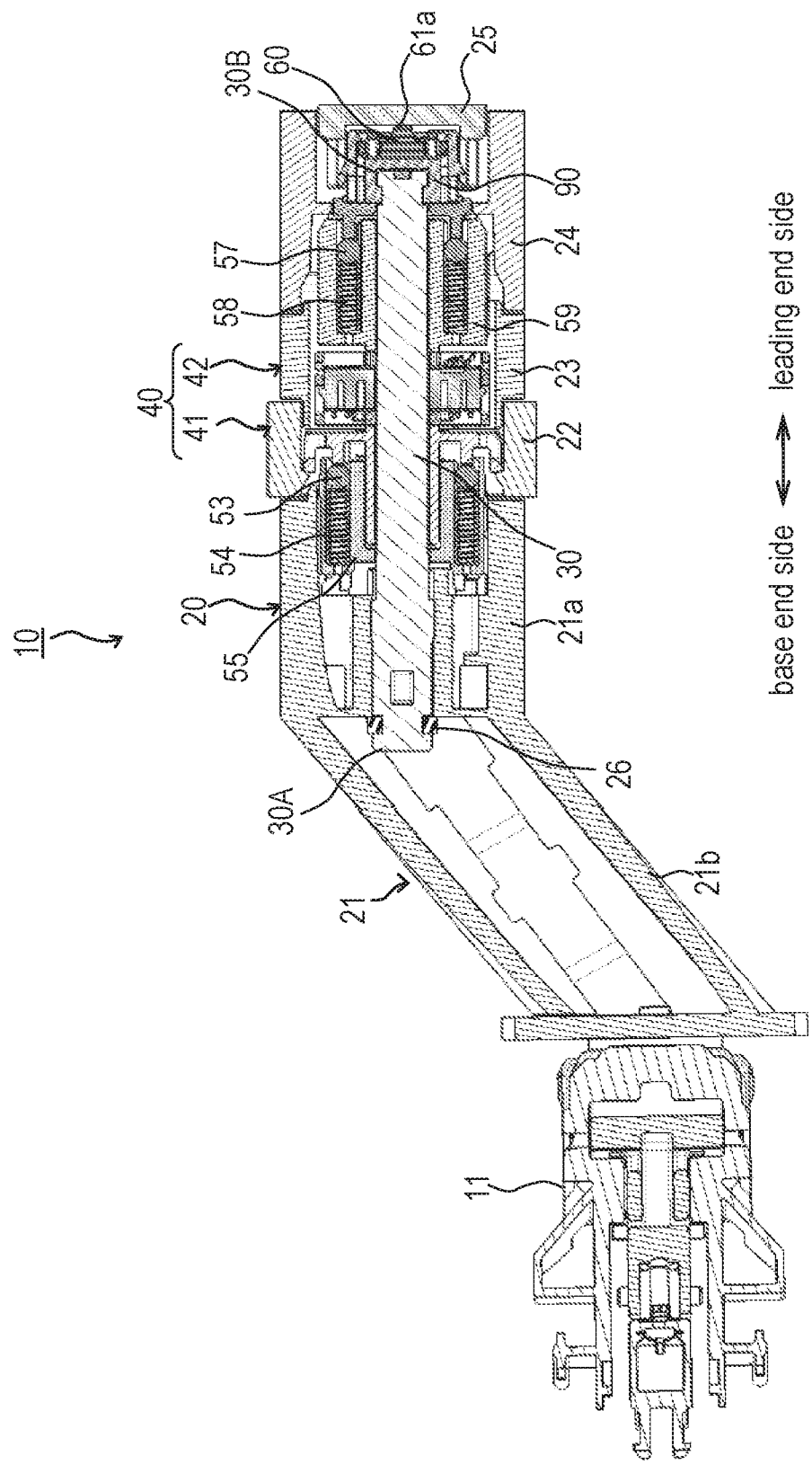
FIG. 1A is a sectional view of a lever switch device in accordance with an exemplary embodiment of the present disclosure.

FIG. 1A is a sectional view of lever switch device 10 in accordance with an exemplary embodiment of the present disclosure. FIG. 2A is an exploded perspective view of lever switch device 10. Lever switch device 10 is, for example, disposed near an operating or driving device of a vehicle, such as a steering wheel, and is used as an operating lever for a headlight, wiper, and so on. Lever switch device 10 includes case 20 and sliding member 11. With respect to case 20, the side toward sliding member 11 is referred to as a base end side and the other side is referred to as a leading end side.

Case 20 has a bent cylindrical shape and is formed of insulating resin such as ABS and polyamide. Case 20 includes fixed knob 21, first rotary knob 22, second rotary knob 23, tip knob 24, and switch cover 25. Each of fixed knob 21, first rotary knob 22, second rotary knob 23, and tip knob 24 has an inner space, and these knobs are connected in this order such that the inner spaces are mutually communicated.

Fixed knob 21 includes main part 21a and sloped part 21b. Sloped part 21b is placed on the base end side from main part 21a, and tilted relative to main part 21a. A base end of sloped part 21b is connected to sliding member 11, and a leading end of sloped part 21b is connected to a base end of main part 21a.

Main part 21a, first rotary knob 22, second rotary knob 23, and tip knob 24 are coaxially connected to form a substantially cylindrical shape. Shaft member 30, rotary switches 40, and push switch 60 are housed in this substantially cylindrical inner space. Shaft member 30 extends from the base end side to the leading end side. An end part of shaft member 30 on the base end side (namely, a base end) is first end 30A, and an end part on the leading end side (namely, a leading end) is second end 30B. Peripheral part 30C is provided between first end 30A and second end 30B. In other words, shaft member 30 includes peripheral part 30C, first end 30A, and second 30B; and extends in the axial direction passing through first end 30A and second end 30B.

Shaft stopper 26 is fixed onto first end 30A of shaft member 30. Shaft stopper 26 meets a lock part (not illustrated) provided on an inner face of main part 21a, thereby shaft member 30 is engaged with main part 21a in the axial direction. For the convenience of description, a direction parallel to the central axis of shaft member 30 is also called the axial direction.

As shown in FIG. 2A, fixed knob 21 is divided into two parts in a direction perpendicular to the axial direction, and is formed of first knob member 27 and second knob member 28. For example, fixed knob 21 is formed by covering an opening of first knob member 27 with second knob member 28.

First rotary knob 22 is connected to first rotary member 44 of rotary switches 40 described later, and functions as a rotary operation member together with first rotary member 44 and first contact piece 50. The rotary operation member is rotated about shaft member 30 by the user. Second rotary knob 23 is connected to second rotary member 46 of rotary switches 40 described later, and functions as a rotary operation member together with second rotary member 46 and second contact piece 51. The rotary operation member is also rotated about shaft member 30 by the user. First rotary knob 22 and first rotary member 44 may be integrally provided to function as the rotary operation member, and second rotary knob 23 and second rotary member 46 may be integrally provided to function as the rotary operation member.

Switch cover 25 is a push operation part pressed by the user, and is movably disposed in a manner movable in the axial direction with respect to tip knob 24. Switch cover 25 is provided in the state in contact with push switch 60 attached to the shaft member 30 on the leading end side from the rotary operation member, and moves back and forth together with displacement part 61a of push switch 60.

<Structure of Rotary Switch>

As shown in FIG. 2A, rotary switches 40 in the exemplary embodiment include first rotary switch 41 and second rotary switch 42. However, the number of rotary switches 40 is not limited. It may be one, or three or more. Rotary knobs corresponding to the number of rotary switches 40 are provided in case 20 shown in FIG. 1A.

First rotary switch 41 includes fixed member 43, first rotary member 44, and first click mechanism 45. Second rotary switch 42 includes fixed member 43, second rotary member 46, and second click mechanism 47. In the exemplary embodiment, first rotary switch 41 and second rotary switch 42 share one fixed member 43. However, separate fixed members may be provided to first rotary switch 41 and second rotary switch 42.

Fixed member 43 has a ring shape with insertion hole 43a through which shaft member 30 passes. A blocking part (not illustrated) for preventing the rotation of fixed member 43 with respect to shaft member 30 is formed on a inner face of fixed member 43. The inner face of fixed member 43 defines insertion hole 43a. This blocking part fixes fixed member 43 to shaft member 30 inserted into insertion hole 43a.

Fixed member 43 supports first board part 71 on at least one of end faces ($f_{aces}$) thereof on the base end side and leading end side. In the exemplary embodiment, first board part 71 includes first rotary board part 73 for first rotary switch 41 and second rotary board part 74 for second rotary switch 42. Therefore, first rotary board part 73 is disposed on the face of fixed member 43 on the base end side, and second rotary board part 74 is disposed on the face of fixed member 43 on the leading end side. However, fixed member 43 may support first board part 71 by at least one of the faces thereof on the base end side and the leading end side, depending on the number of rotary switches 40 and layout of fixed member 43 and the rotary member.

Figure 5B:
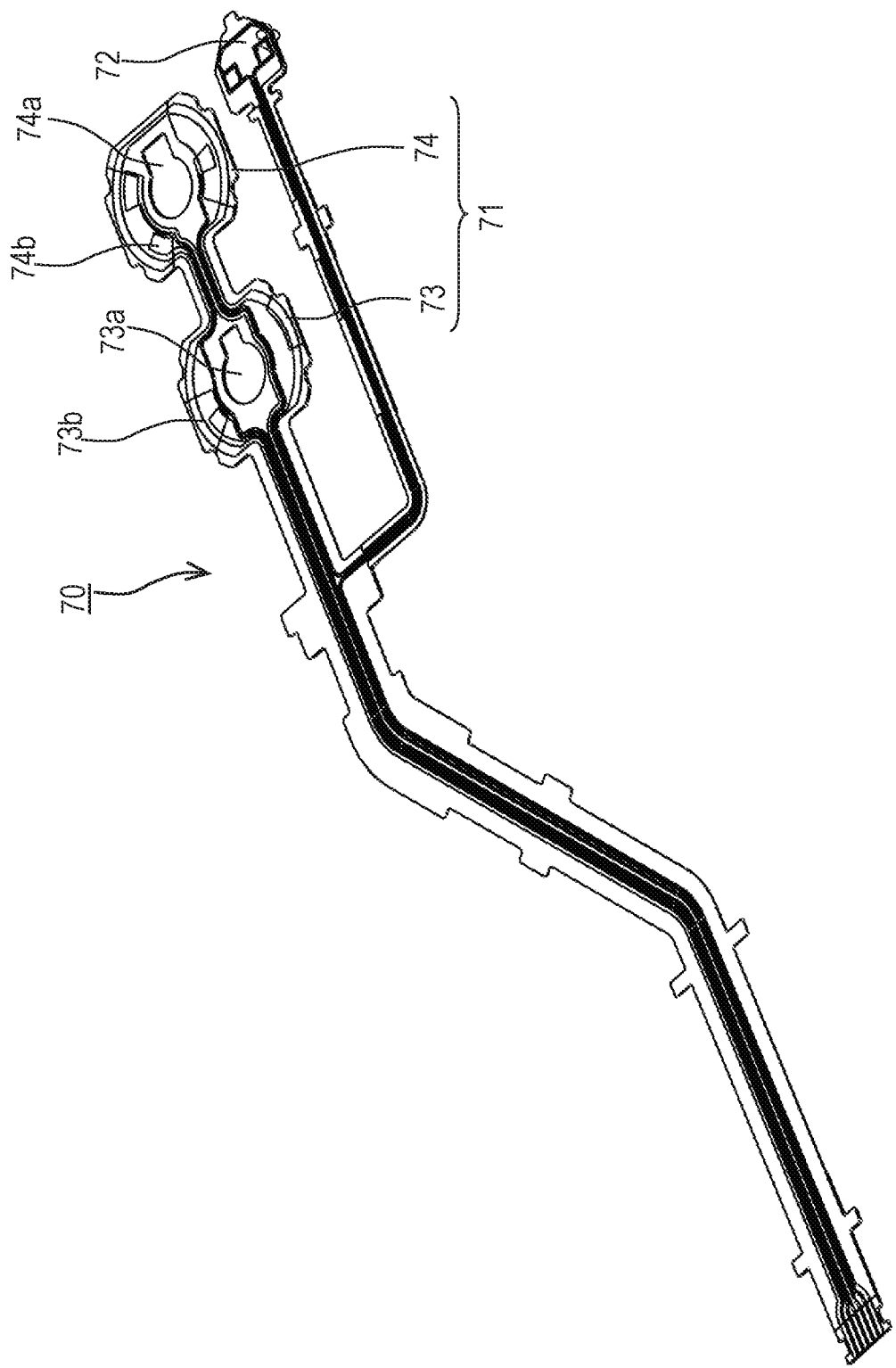
FIG. 5B is a perspective view of a back side of the flexible board illustrated in FIG. 5A.

As shown in FIG. 5B described later, first rotary board part 73 and second rotary board part 74 have fixed contacts 73b and 74b, respectively, and are formed of, for example, flexible printed circuit (FPC) 70. FPC 70 is detailed later.

First board cover 48 fixes first rotary board part 73 onto the face of fixed member 43 on the base end side. Second board cover 49 fixes second rotary board part 74 onto the face of fixed member 43 on the leading end side. In other words, first board cover 48 supports first rotary board part 73 between first board cover 48 and the end face of fixed member 43, and second board cover 49 supports second rotary board part 74 between second board cover 49 and the end face of fixed member 43. In this way, lever switch device 10 is downsized by interposing one fixed member 43 between a set of first rotary board part 73 and first board cover 48 and a set of second rotary board part 74 and second board cover 49.

Ring-shaped first board cover 48 is provided with insertion hole 48a through which shaft member 30 passes. First board cover 48 also has a first opening (not illustrated) and a first claw part (not illustrated). The first opening is different from insertion hole 48a. First board cover 48 is attached to fixed member 43 by this first claw part in such a manner that first rotary board part 73 is sandwiched by first board cover 48 and fixed member 43 therebetween. In this state, fixed contacts 73b of first rotary board part 73 are exposed from the first opening in such a manner that fixed contacts 73b can contact movable contacts 50a of first contact piece 50 described later.

Ring-shaped second board cover 49 is provided with insertion hole 49a through which shaft member 30 passes. Second board cover 49 also has a second opening (not illustrated) and a second claw part (not illustrated). The second opening is different from insertion hole 49a. Second board cover 49 is attached to fixed member 43 by this second claw part in such a manner that second rotary board part 74 is sandwiched by second board cover 49 and fixed member 43 therebetween. In this state, fixed contacts 74b of second rotary board part 74 are exposed from the second opening in such a manner that fixed contacts 74b can contact movable contacts 51a of second contact piece 51.

Ring-shaped first rotary member 44 is provided with insertion hole 44a through which shaft member 30 passes. First rotary member 44 is externally fitted to the middle of shaft member 30 in a manner rotatable about shaft member 30 by inserting shaft member 30 into insertion hole 44a. First rotary member 44 is housed in first rotary knob 22 in a fixed state. This make first rotary member 44 rotates according to the rotation of first rotary knob 22.

Figure 2B:
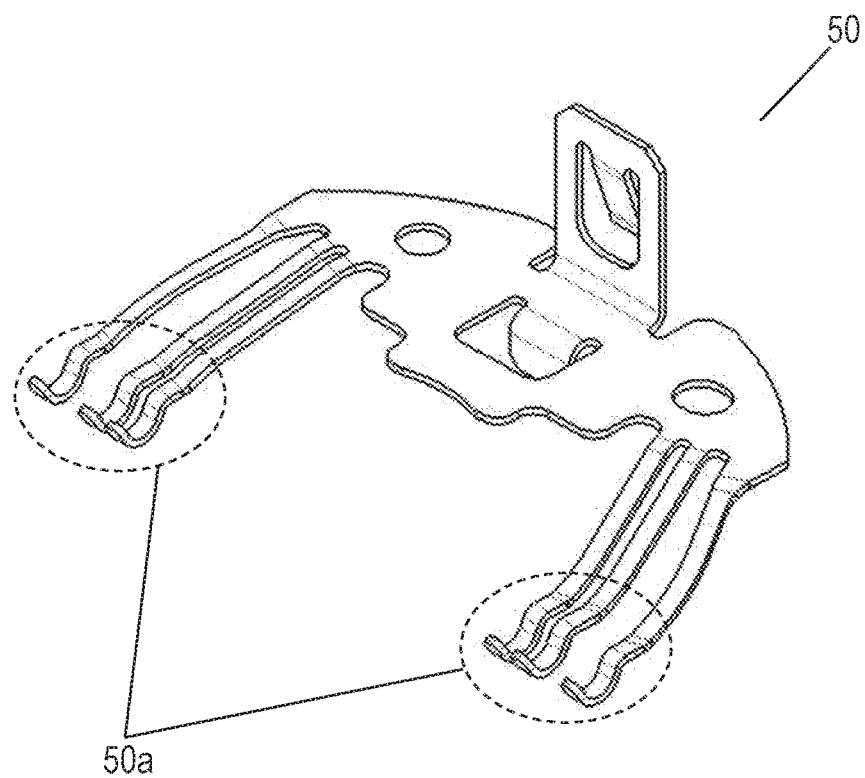
FIG. 2B is a perspective view of a first contact piece of the lever switch device illustrated in FIG. 2A.

FIG. 2B is a perspective view of first contact piece 50. First contact piece 40 having movable contacts 50a is attached to the face of first rotary member 44 on the leading end side. First contact piece 50 faces first rotary board part 73 via first board cover 48 in between. Therefore, when first contact piece 50 rotates according to the rotation of first rotary member 44, movable contacts 50a of first contact piece 50 move to come into contact with or separate from fixed contacts 73b of first rotary board part 73. A signal of first rotary switch 41 is generated based on positions of movable contacts 50a relative to fixed contacts 73b. The rotary operation member formed of first rotary knob 22, first rotary member 44, and first contact piece 50, as described above, is provided outside shaft member 30 at a position between first end 30A and second end 30B. The rotary operation member is operable in a rotation manner about shaft member 30, and also has movable contacts 50a.

Ring-shaped second rotary member 46 is provided with insertion hole 46a through which shaft member 30 passes. Second rotary member 46 is externally fitted to the middle of shaft member 30 in a manner rotatable about shaft member 30 by inserting shaft member 30 into insertion hole 46a. Second rotary member 46 is housed in second rotary knob 23 in a fixed state. This makes second rotary member 46 rotate according to the rotation of second rotary knob 23.

Figure 2C:
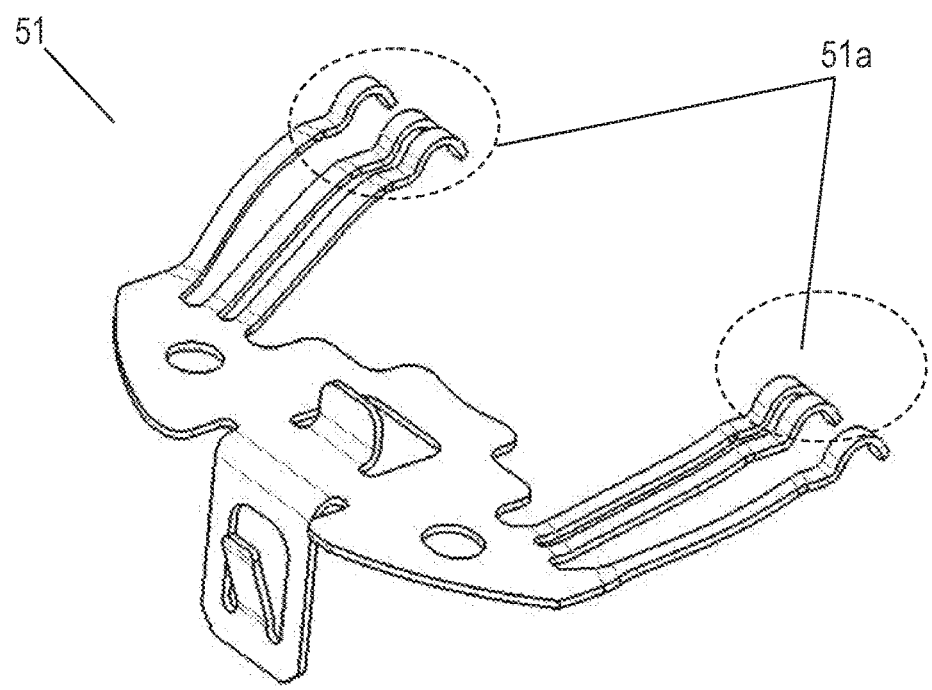
FIG. 2C is a perspective view of a second contact piece of the lever switch device illustrated in FIG. 2A.

FIG. 2C is a perspective view of second contact piece 51. Second contact piece 51 having movable contacts 51b is attached to the face of second rotary member 46 on the base end side. Second contact piece 51 faces second rotary board part 74 via second board cover 49 in between. Therefore, when second contact piece 51 rotates according to the rotation of second rotary member 46, movable contacts 51b of second contact piece 51 move to come into contact with or separate from fixed contacts 74b of second rotary board part 74. A signal of second rotary switch 42 is generated based on positions of movable contacts 51b relative to fixed contacts 74b. A rotary operation member formed of second rotary knob 23, second rotary member 46, and second contact piece 51, as described above, is provided outside shaft member 30 at a position between first end 30A and second end 30B. The rotary operation member is operable in a rotation manner about shaft member 30, and has movable contacts 51a.

First click mechanism 45 gives a click feeling to the user in response to the rotation of first rotary member 44. As shown in FIG. 2A, first click mechanism 45 includes first click face 52, first balls 53, first springs 54, and first housing member 55. In the exemplary embodiment, first balls 53 and first springs 54 are provided two each. However, one each or three or more each is also applicable.

Ring-shaped first housing member 55 is provided with insertion hole 55a through which shaft member 30 passes. A blocking part (not illustrated) for preventing the rotation of first housing member 55 with respect to shaft member 30 is formed on an inner face of first housing member 55. The inner face of first housing member 55 defines insertion hole 55a. The blocking part fixes first housing member 55 onto shaft member 30 inserted into insertion hole 55a.

Figure 1B:
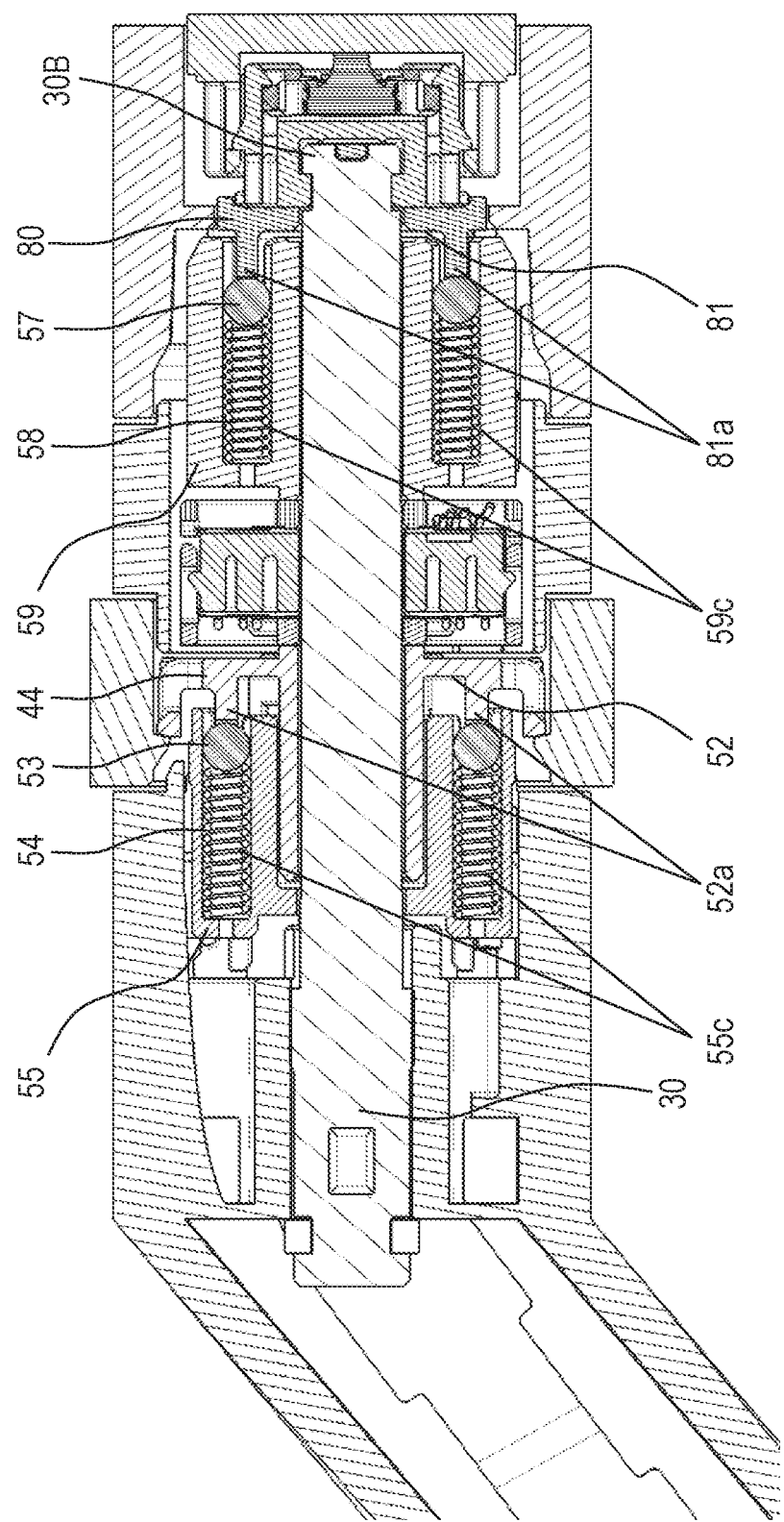
FIG. 1B is a partially magnified view of FIG. 1A.

As shown in FIG. 1B, first housing member 55 has housing spaces 55c, and is attached to shaft member 30 such that housing spaces 55c are opened on the leading end side. In other words, housing spaces 55c extend in the axial direction and are opened toward second end 30B. First click face 52 is disposed adjacent to the leading end side of first housing member 50 where first housing member 50 is opened. Each set of first ball 53 and first spring 54 is housed in respective one of housing spaces 55c such that first ball 53 contacts first click face 52 and first spring 54 urges first ball 53 toward first click face 52 to the leading end side.

First click face 52 is provided on the face of first rotary member 44 on the base end side. First click face 52 has, for example, multiple click protrusions 52a protruding toward the base end side and radially disposed centering on insertion hole 44a. In other words, click protrusions 52a protruding toward first end 30A are formed in the axial direction on first click face 52. This makes first ball 53 contact click protrusions 52a as first click face 52 of first rotary member 44 rotates to generate the click feeling.

Second click mechanism 47 gives a click feeling to the user in response to the rotation of second rotary member 46. As shown in FIG. 2A, second click mechanism includes click member 80, second balls 57, second springs 58, and second housing member 59. In the exemplary embodiment, second balls 57 and second springs 58 are provided two each. However, one each or three or more each is also applicable.

Ring-shaped click member 80 is provided with insertion hole 80a through which shaft member 30 passes. A blocking part (not illustrated) for preventing the rotation of click member 80 with respect to shaft member 30 is formed on an inner face of click member 80. The inner face of click member 80 defines insertion hole 80a. This blocking part fixes click member 80 onto shaft member 30 inserted into insertion hole 80a.

Second click face 81 is provided on the face of click member 80 on the base end side. Second click face 81 has, for example, multiple click protrusions 81a protruding toward the base end side and radially disposed centering on insertion hole 80a. In other words, click protrusions 81b protruding toward first end 30A are formed in the axial direction on second click face 81.

Second housing member 59 is provided on second rotary member 46, and has housing spaces 59c. Second housing member 59 is attached to shaft member 30 such that housing spaces 59c are opened on the leading end side. In other words, housing spaces 59c extend in the axial direction and are opened toward second end 30B. Second click face 81 is disposed adjacent to the leading end side of second housing member 59 where second housing member 59 is opened. Each set of second ball 57 and second spring 58 is housed in respective one of housing spaces 59c such that second ball 57 contacts second click face 81 and second spring 58 urges second ball 57 toward second click face 81 to the leading end side. With this structure, second housing member 59 rotates according to the rotation of second rotary member 46, and second ball 57 inside second housing member 59 contacts click protrusion 81b to generate the click feeling.

<Structure of Push Switch>

As shown in FIG. 1A, push switch 60 is attached to second end 30B of shaft member 30. Push switch 60 includes displacement part 61b and multiple terminals (not illustrated). These terminals are connected to second board part 72 shown in FIG. 2A. When displacement part 61b displaces by a push operation, a switch contact (not illustrated) inside push switch 60 opens or closes. A signal generated by this opening or closing is output from the terminal to second board part 72.

In the exemplary embodiment, a tactile switch is employed as push switch 60. The tactile switch has a click mechanism that generates a click feeling in response to the push operation by the user, and gives the click feeling to the user. However, push switch 60 is not limited to the tactile switch as long as it is an operation switch that opens or closes (inputs) the contact when displacement part 61b moves in the axial direction by being pressed typically with a finger.

Figure 3A:
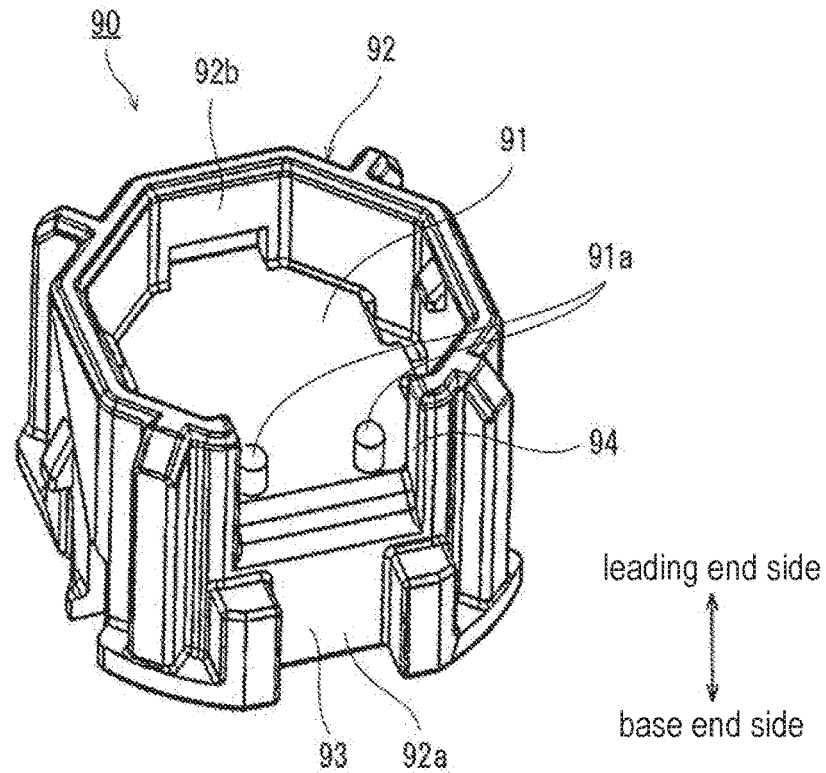
FIG. 3A is a perspective view of a holder of the lever switch device illustrated in FIG. 1A seen from a leading end of the lever switch device.
Figure 3B:
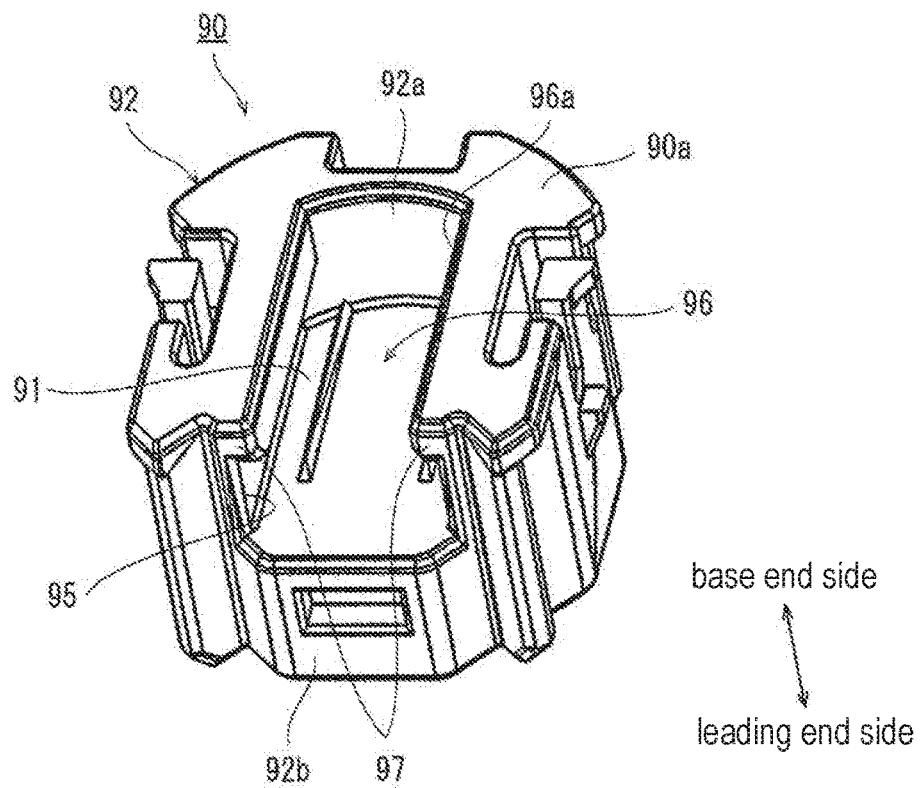
FIG. 3B is a perspective view of the holder illustrated in FIG. 3A seen from a base end of the lever switch device.

As shown in FIG. 1A, push switch 60 is held by holder 90 and fixed onto shaft member 30. In addition, push switch 60 is electrically connected to second board part 72 as shown in FIG. 2A. As shown in FIG. 3A, holder 90 includes placement part 91, wall part 92, and first route 93. FIG. 3A is a perspective view of holder 90 seen from the leading end side, and FIG. 3B is a perspective view of holder 90 seen from the base end side. First route 93 is described later.

Push switch 60 and second board part 72 are placed on placement part 91. Placement part 91 has, for example, a flat octagonal plate shape. Wall part 92 has, for example, an octagonal cylindrical shape in cross section so as to surround placement part 91. Wall part 92 includes first wall part 92a and second wall part 92b facing first wall part 92a. First wall part 92a is provide with first notch 94 on the leading end side from placement part 91. A pair of protrusions 91b are provided on a face of placement part 91 on the leading end side. Protrusions 91a are disposed with a space in between, near first notch 94.

As shown in FIG. 3B, holder 90 is provided with second notch 95 and holder groove 96 on the base end side thereof. Second notch 95 is provided on second wall part 92b at a portion on the based end side from placement part 91. Second notch 95 is disposed on the opposite side of first notch 94 with placement part 91 in between.

Holder groove 96 extends between second notch 95 and first wall part 92a. Holder groove 96 has a first end which is open on by second notch 95, and a second end which is closed by first wall part 9a. Holder groove 96 is also open on the base end side by opening 96a and closed on the leading end side by placement part 91.

A pair of protruding parts 97 is provided on a pair of inner faces of wall part 92, respectively. The inner faces defines holder groove 96. Protruding parts 97 protrude from the inner faces of wall part 92 in a protruding direction that intersects with a extending direction of holder groove 96 and the axial direction. Protruding parts 97 faces each other. In the exemplary embodiment, the protruding direction of protruding parts 97 is orthogonal to the extending direction of holder groove 96 and the axial direction.

Protruding parts 97 are attachment parts for attaching holder 90 to shaft member 30 shown in FIG. 2A, and protrude from the inner faces of wall part 92 to narrow the distance in between. Namely, the distance between protruding parts 97 is narrower than a width of holder groove 96. Protruding parts 97 extend along holder groove 96 on a rim of holder 90 on the base end side.

Figure 4:
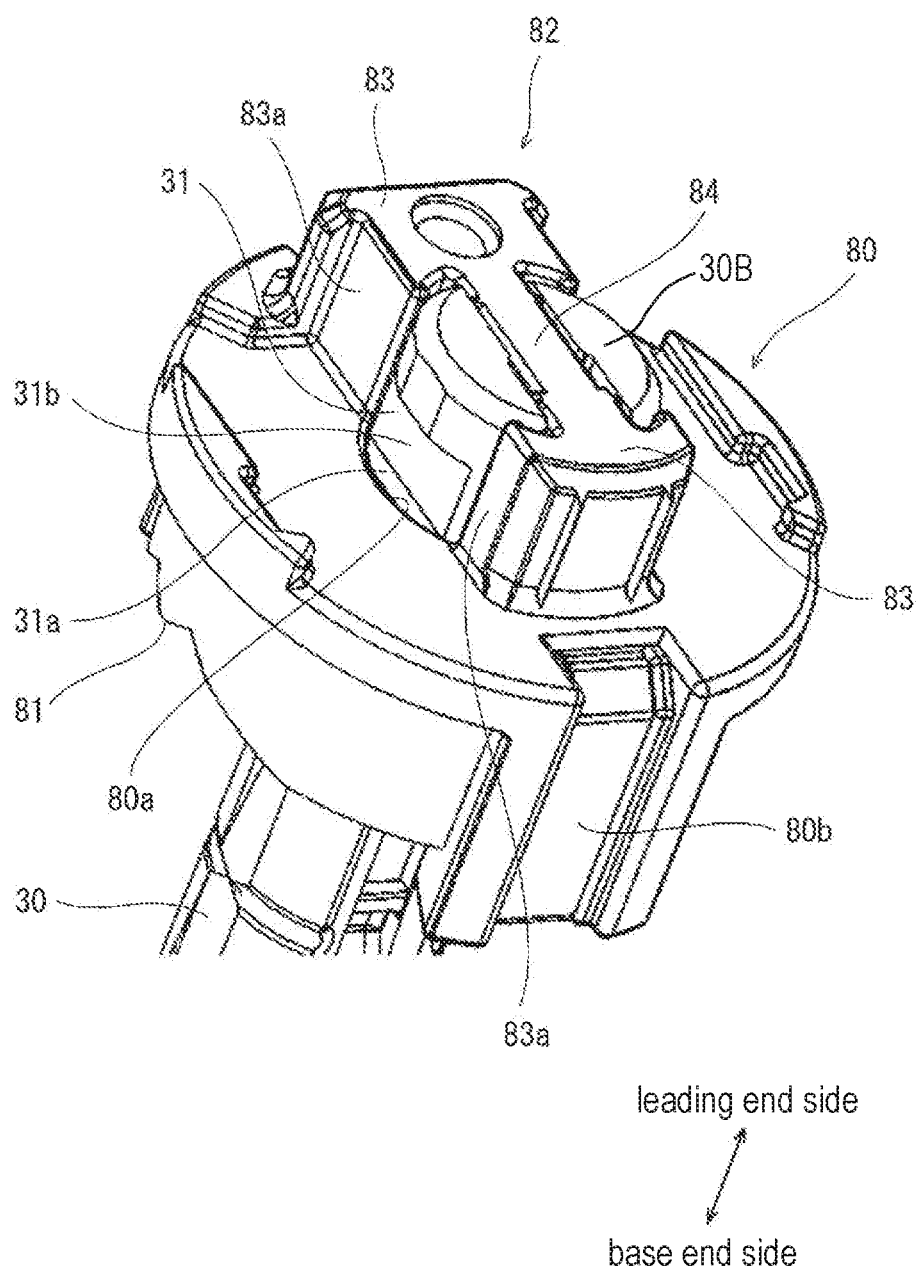
FIG. 4 is a perspective view of a shaft member and a click member attached to a tip of the shaft member of the lever switch device illustrated in FIG. 1A.

As shown in FIG. 4, shaft member 30 is provided with a pair of shaft grooves 31 near a tip thereof. FIG. 4 shows only one of shaft grooves 31, but another of shaft grooves 31 passes in the axial direction and is provided symmetry with respect to a plane parallel to aforementioned shaft groove 31. Accordingly, shaft grooves 31 are parallel to each other, and extend in a direction intersecting with the axial direction in peripheral part 30C (see FIG. 2A) of shaft member 30. In the exemplary embodiment, shaft grooves 31 extend in a direction orthogonal to the axial direction.

As shown in FIG. 4, click member 80 has lock part 82 on the leading end side. Lock part 82 includes a pair of base parts 83 and bridge part 84. The pair of base parts 83 protrudes from a face of click member 80 on the leading end side, and is disposed with a distance in between. Bridge part 84 is flat and links edges of base parts 83 on the leading end side.

Shaft member 30 passing through insertion hole 80a of click member 80 is disposed between the pair of base parts 83, and second end 30B of shaft member 30 is locked by contacting bridge part 84. In this state, shaft grooves 31 of shaft member 30 appears on the face of click member 80 on the leading end side, and faces 31b of shaft members 30 on the base end side defining shaft groove 31 become leveled with the face of click member 80 on the leading end side. Faces 31b that are the bottom faces of shaft grooves 31 are parallel to the axial direction, and also extend in a direction same as the extending direction of bridge part 84. Each of faces 31b is leveled with side faces 83a of base parts 83.

Lock part 82 of click member 80, as described above, is fitted to holder groove 96 of holder 90 via second notch 95 and opening 96a on the base end side, as shown in FIG. 3B and FIG. 4. Accordingly, holder 90 is installed to shaft member 30 in a direction intersecting with the axial direction, and attached to second end 30B of shaft member 30.

Edge 90a of holder 90 on the base end side is disposed on face 31b of shaft groove 31 on the base end side leveled with the face of click member 80 on the leading end side. Lock part 82 contacts first wall 92a of holder 90. Furthermore, protruding parts 97 of holder 90 is fitted to shaft groove 31 of shaft member 30 by assembling protruding parts 97 along side faces 83a of base parts 83 leveled with faces 31b of shaft grooves 31 in a direction intersecting with the axial direction. This structure secures holder 90 to click member 80 and shaft member 30 connected to click member 80 in the axial direction and the direction perpendicular to the axial direction.

Push switch 60 thus fixed onto shaft member 30 is covered with switch cover 25 shown in FIG. 1A. Here, switch cover 25 is connected to holder 90 such that switch cover 25 can move back and forth in the axial direction while switch cover 25 is in contact with displacement part 61b of push switch 60. Switch cover 25 may cover push switch 60 so as to slightly urge push switch 60 in order to be more reliably in contact with push switch 60.

<FPC>

Next, FPC 70 is described with reference to FIG. 2A, FIG. 5A, and FIG. 5B. FIG. 5A is a perspective view of FPC 70, and FIG. 5B shows a back side of FIG. 5A. Multiple wirings where signals detecting displacement (a positional shift) of the rotary operation member and push switch 60 pass are embedded in one FPC 70, and extend from the base end side to the leading end side. More specifically, FPC 70 includes connecting terminal 75, a wiring part, first board part 71, and second board part 72. In the exemplary embodiment, first board part 71 includes first rotary board part 73 and second rotary board part 74 corresponding to the number of rotary switches 40.

Ring-shaped first rotary board part 73 and second rotary board part 74 are provide with insertion holes 73a and 74a, respectively. Second board part 72 is formed with a dimension to be placed on placement part 91 of holder 90. A portion between second board part 72 and second wiring part 78 is provided with a pair of notches 72a. As shown in FIG. 5B, first rotary board part 73 has fixed contacts 73b thereon, and second rotary board part 74 has fixed contacts 74b thereon.

The wiring part includes first wiring part 77, second wiring part 78, and integrated wiring part 79. First wiring part 77 and second wiring part 78 are branched from integrated wiring part 79 and extend to the leading end side. Branch point 76 of first wiring part 77 and second wiring part 78 exists on the base end side from first board part 71, and between first rotary board part 73 and connecting terminal 75. Connecting terminal 75 is connected to integrated wiring part 79 on the base end side.

First wiring part 77 includes wiring part 77a and wiring part 77b. An end of wiring part 77a on the base end side is branch point 76, and first rotary board part 73 is connected to wiring part 77a on the leading end side. First rotary board part 73 is connected to the base end side of wiring part 77b and second rotary board part 74 is connected to the leading end side of wiring part 77b. For example, integrated wiring part 79, wiring part 77a, and wiring part 77b linearly extend so that connecting terminal 75, branch point 76, first rotary board part 73, and second rotary board part 74 are linearly aligned.

The end of second wiring part 78 on the base end side is branch point 76, and second board part 72 is connected to second wiring part 78 on the leading end side. For example, second wiring part 78 extends from branch point 76 in a direction orthogonal to the extending direction of first wiring part 77, and is then bent to extend to the leading end side in a direction parallel to the extending direction of first wiring part 77 at a distance from first wiring part 77. According to the structure, second wiring part 78 is disposed facing first wiring part 77 by bending second wiring part 78 near branch point 76.

As described above, FPC 70 has multiple wirings, and these wirings include a first group of wirings 77A and a second group of wirings 78A different from the first group of wirings 77A. FPC 70 has first board part 71, second board part 72, first wiring part 77, second wiring part 78, and integrated wiring part 79. As described above, first board part 71 has fixed contacts 73b and 74b where movable contacts 50a can come into contact with or separate from in response to a positional shift of the rotary operation member. Second board part 72 receives the signal output from push switch 60. First wiring part 77 includes the first group of wirings 77A, and is connected to first board part 71. Second wiring part 78 includes the second group of wirings 78A, and is connected to second board part 72. In integrated wiring part 79, first wiring part 77 and second wiring part 78 are integrated, and integrated wiring part 79 is at a position away from first board part 71 and second board part 72.

Figure 6:
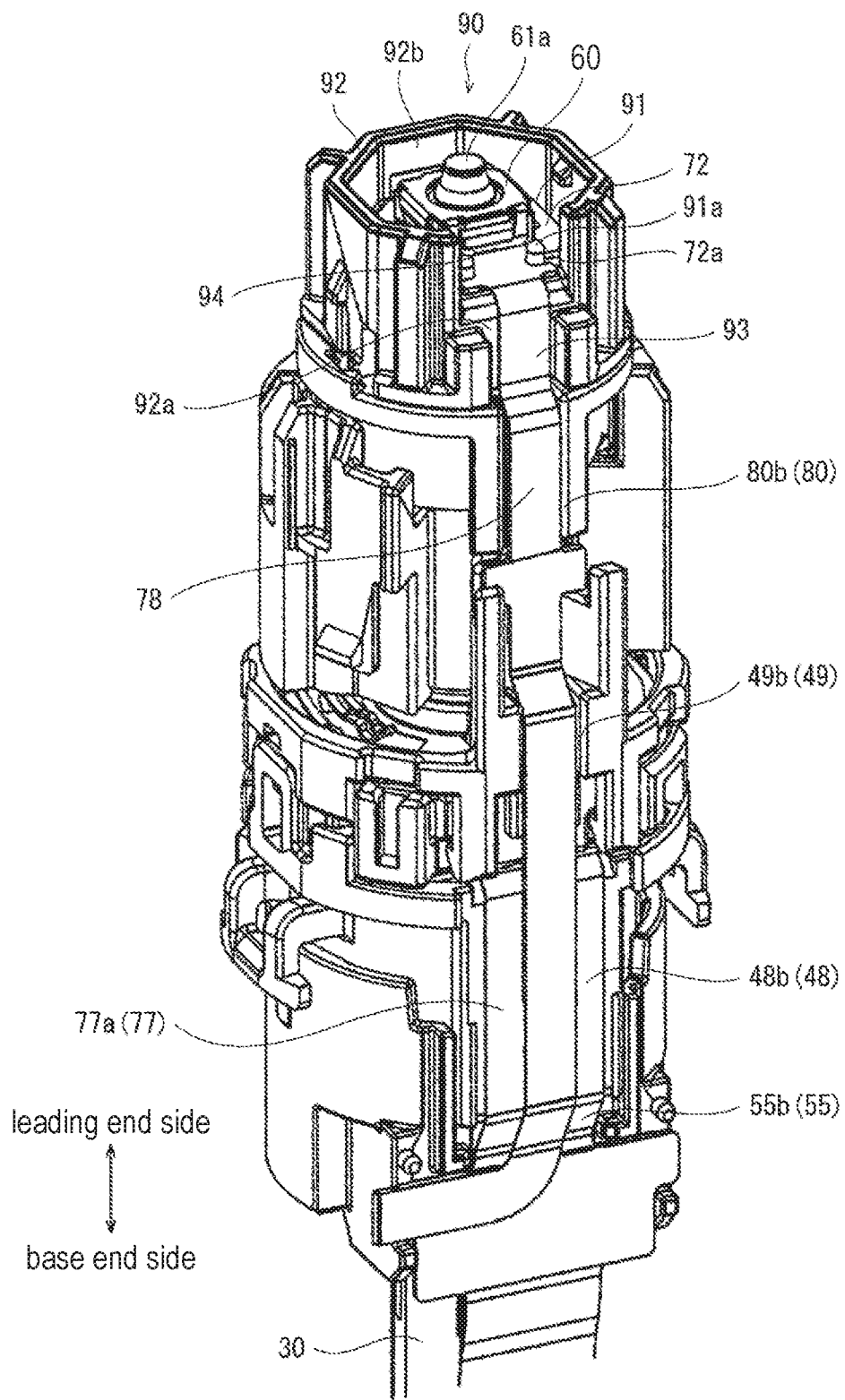
FIG. 6 is a perspective view of a second board part and a placement part on which the second board part is placed, a second wiring part, an integrated wiring part, and a wiring route thereof in the lever switch device illustrated in FIG. 2A.

As shown in FIG. 6, a wiring route supporting second wiring part 78 described above is provided on lever switch device 10. FIG. 6 is a perspective view of second board part 72 shown in FIG. 2A, placement part 91 shown in FIG. 3A, second wiring part 78 shown in FIG. 2A, and the wiring route thereof. For example, this wiring route includes first route 93, second route 80b, third route 49b, fourth route 48b, and fifth route 55b.

First route 93 is a groove provided on first wall part 92a of holder 90, and is continued to the face of placement part 91 on the leading end side via first notch 94. Second route 80b is formed on the side face of click member 80 and protrudes from the side face of click member 80 to the base end side. Third route 49b is formed on the side face of second board cover 49, and protrudes from the side face of second board cover 49 to the leading end side. Fourth route 48b is formed on the side face of first board cover 48, and protrudes from the side face of first board cover 48 to the base end side. Fifth route 55b is formed on the side face of first housing member 55. Accordingly, part of the wiring route supporting second wiring part 78 is provided on first board cover 48 and second board cover 49.

Holder 90, click member 80, second board cover 49, first board cover 48, and first housing member 55 are attached to shaft member 30 shown in FIG. 1A in this order. Accordingly, first route 93, second route 80b, third route 49b, fourth route 48b, and fifth route 55b are disposed in this order, and extend linearly in parallel with shaft member 30. This wiring route supports second wiring part 78.

A portion of first wiring part 77 overlapping with second wiring part 78 is also disposed in fourth route 48b and fifth route 55b. Since the wiring route supports first wiring part 77, in addition to second wiring part 78, lever switch device 10 can be downsized.

Furthermore, as shown in FIG. 2A, lever switch device 10 includes wiring cover 110 and holder cover 100. Wiring cover 110 has a substantially rectangular long flat shape. Wiring cover 110 covers and fixes a portion of second wiring part 78 placed in second route 80b, third route 49b, fourth route 48b, and fifth route 55b, and the portion of first wiring part 77 placed in fourth route 48b and fifth route 55b.

Figure 7:
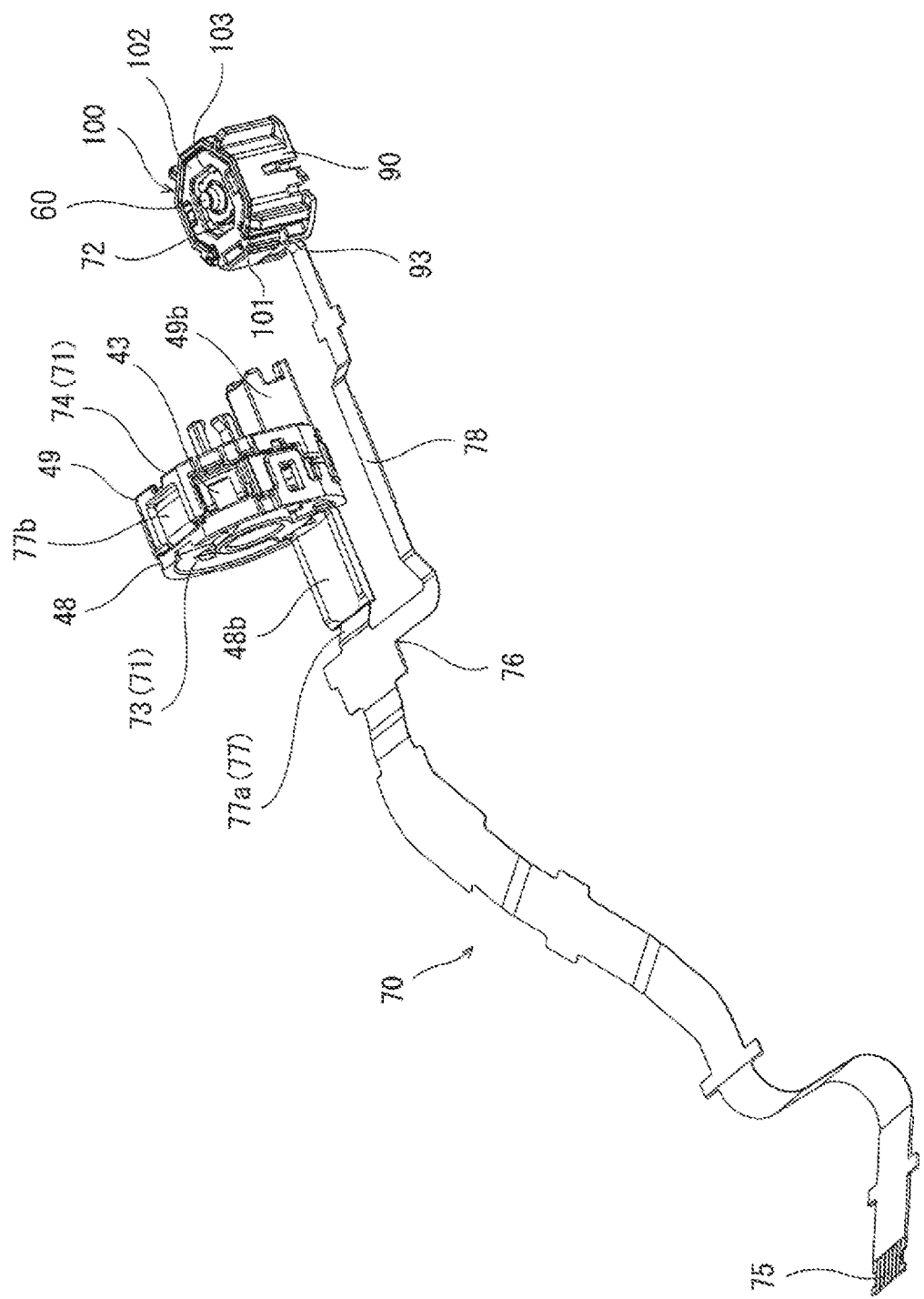
FIG. 7 is a perspective view of a first board part and a fixed member for supporting the first board part, and the second board part and a holder for holding the second board part of the lever switch device illustrated in FIG. 2A.

As shown in FIG. 7, holder cover 100 includes wiring-covering portion 101 and board-covering portion 102. FIG. 7 is a perspective view of first board part 71, fixed member 43, second board part 72, and holder 90 shown in FIG. 2A. Wiring-covering portion 101 has a substantially rectangular flat shape, and extends from board-covering portion 102 to the base end side to cover and fix a portion of second wiring part 78 placed in first route 93.

Board-covering portion 102 fixes second board part 72 placed in placement part 91 of holder 90. For example, board-covering portion 102 has an octagonal flat plate shape corresponding to the shape of placement part 91. Board-covering portion 102 is provided with opening 103 at a position facing push switch 60. Accordingly, displacement part 61b of push switch 60 protrudes from board-covering portion 102 via opening 103 to come into contact with switch cover 25 shown in FIG. 1A.

<Assembly Method of Lever switch Device>

First, as shown in FIG. 7, first rotary board part 73 of FPC 70 is bent so as to be perpendicular to wiring part 77a. Then, first rotary board part 73 is disposed on the face of fixed member 43 on the base end side and attached to fixed member 43 by first board cover 48. Next, wiring part 77b is bent so as to be perpendicular to first rotary board part 73. Wiring part 77b is then extended along the side face of fixed member 43 from the face on the base end side to the face on the leading end side. After that, second rotary board part 74 is bent so as to be perpendicular to wiring part 77b. Second rotary board part 74 is then disposed on the face of fixed member 43 on the leading end side, and attached to fixed member 43 by second board cover 49.

As shown in FIG. 6 and FIG. 7, push switch 60 is soldered onto second board part 72 of FPC 70. Second board part 72 is then disposed on placement part 91 of holder 90. At this time, the pair of notches 72a of second board part 72 are fitted to the pair of protrusions 91b of placement part 91, thereby positioning second board part 72 with respect to placement part 91. To facilitate understanding, holder cover 100 is not illustrated in FIG. 6.

Next, second wiring part 78 is bent at first notch 94 of holder 90. Second wiring part 78 is then placed on first route 94 continuing to first notch 94.

Next, board-covering portion 102 of holder cover 100 is attached to placement part 91 so as to cover second board part 72. This makes second board part 72 fixed onto holder 90. At this time, wiring-covering portion 101 of holder cover 100 is placed along first notch 94 of placement part 91. Thus, second wiring part 78 is covered with wiring-covering portion 101 and fixed onto first route 93.

Figure 8:
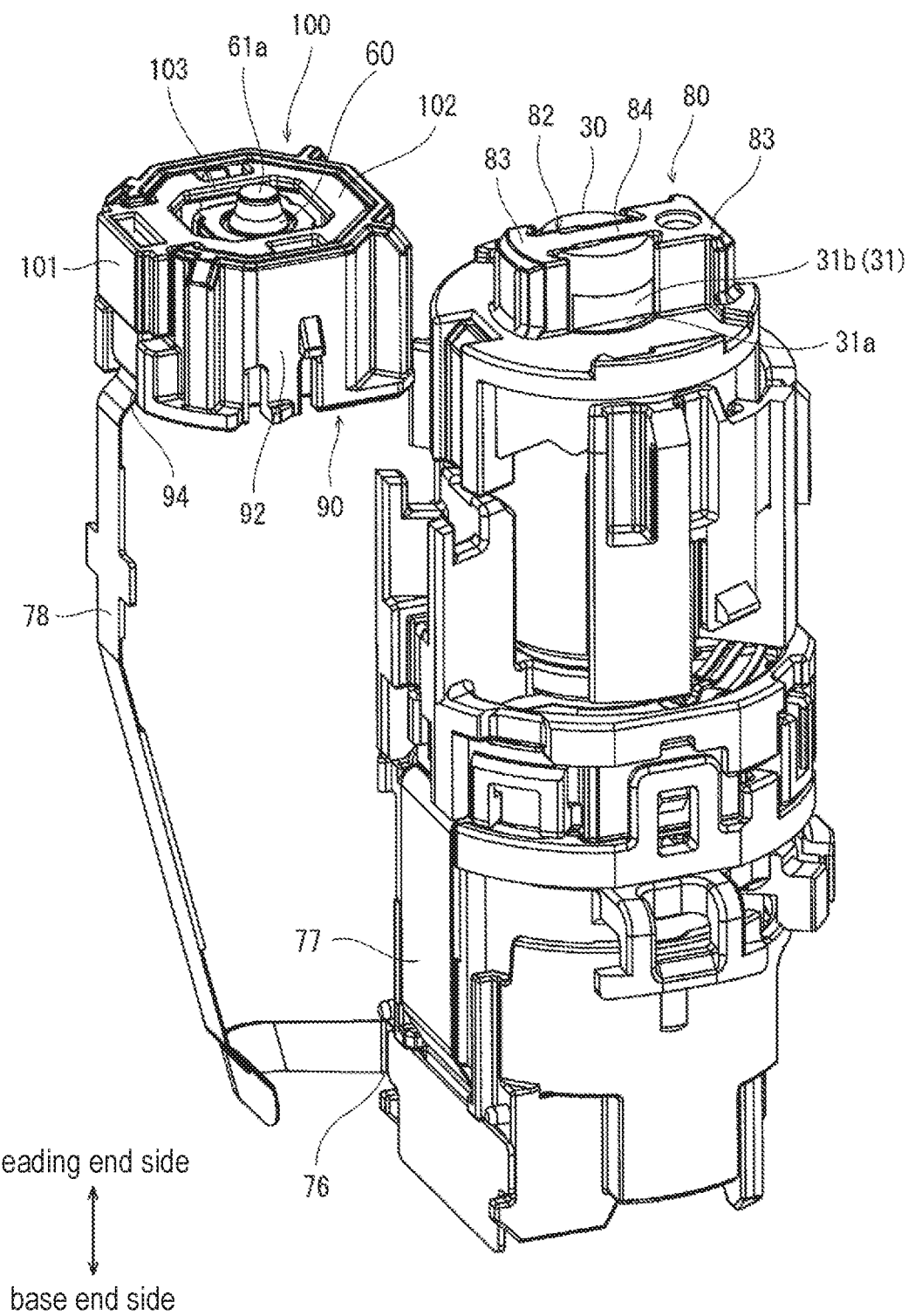
FIG. 8 is a perspective view illustrating the state where the holder is attached to the shaft member.

Then, as shown in FIG. 8, the base end of shaft member 30 is placed, for example, lower than the leading end thereof. FIG. 8 is a perspective view illustrating the state of mounting holder 90 onto shaft member 30. First housing member 55 is disposed such that the openings of first housing member 55 shown in FIG. 2A face up, and first balls 53 and first springs 54 are housed in these openings, respectively. Shaft member 30 is then passed through insertion hole 55a of first housing member 55, and first housing member 55 is attached to shaft member 30. Then, shaft member 30 is passed through insertion hole 44a of first rotary member 44 such that first click face 52 of first rotary member 44 faces first housing member 55, and first rotary member 44 is attached to shaft member 30. Thus, first springs 54 push first balls 53, respectively, toward first click face 52, thereby forming first click mechanism 45.

Shaft member 30 is passed through the insertion hole of each of components in such a way that first rotary board part 73, first board cover 48, fixed member 43, second rotary board part 74, and second board cover 49 are aligned in this order from the base end side to the leading end side. This makes first rotary board part 73, first board cover 48, fixed member 43, second rotary board part 74, and second board cover 49 attached to shaft member 30. At this time, first rotary board part 73 is disposed so as to face first contact piece 50 on first rotary member 44, thereby forming first rotary switch 41.

Furthermore, the face of second rotary member 46 on the base end side to which second contact piece 51 is attached is directed downward and shaft member 30 is passed through insertion hole 46a, and second rotary member 46 is attached to shaft member 30. Thereby, second rotary board part 74 is disposed so as to face second contact piece 51, and second rotary switch 42 is formed.

By directing the face of second rotary member 46 on the base end side downward, the openings of second housing member 59 of second rotary member 46 face up. Therefore, second rotary member 46 can be attached to shaft member 30 in the state second balls 57 and second springs 58 are housed in second housing member 59 when shaft member 30 is passed through insertion hole 46a.

Then, shaft member 30 is passed through insertion hole 80a such that second click face 81 of click member 80 faces second rotary member 46, and click member 80 is attached to shaft member 30. Thus, second springs 58 push second balls 57, respectively, toward second click face 81, thereby forming second click mechanism 47.

Attaching click member 80 to shaft member 30, as described above, allows second end 30B of shaft member 30 to come into contact with bridge part 84 of lock part 82 of click member 80, as shown in FIG. 4. And, shaft groove 31 of shaft member 30 becomes apparent on click member 80. Then, as shown in FIG. 3A, holder 90 is disposed such that holder groove 96 shown in FIG. 3B faces downward, second notch 95 is directed to lock part 82 shown in FIG. 4, and holder 90 is moved in a sliding manner. This makes lock part 82 fitted to holder groove 96 via second notch 95, and holder 90 is disposed on second end 30B of shaft member 30.

At this time, lock part 82 contacts second wall part 92b of holder 90, and protruding parts 97 of holder 90 are fitted to shaft grooves 31 of shaft member 30, respectively. This makes holder 90 fixed onto click member 80 in the axial direction and in a direction perpendicular to the axial direction. In addition, holder 90 is fixed onto shaft member 30 connected to click member 80.

Then, second wiring part 78 attached to holder 90 is placed on second route 80b to fifth route 55b, as shown in FIG. 6. At this time, second wiring part 78 is bent and overlaid on first wiring part 77. Wiring cover 110 shown in FIG. 2A is then attached so as to cover first wiring part 77 and second wiring part 78.

Next, an assembled workpiece in which first rotary switch 41, second rotary switch 42, and push switch 60 are mounted to shaft member 30, as described above, is placed into first knob member 27 of fixed knob 21 shown in FIG. 2A. As shown in FIG. 1A, shaft stopper 26 is fixed onto first end 30A of shaft member 30, and shaft stopper 26 is brought into contact with the lock part in main body 21a of first knob member 27 shown in FIG. 2A, so as to stop movement of shaft member 30 toward the base end side. Then, the opening of first knob member 27 is covered with second knob member 28 to form fixed knob 21. Furthermore, as shown in FIG. 1A, first rotary knob 22 and second rotary knob 23 are attached to fixed knob 21.

Switch cover 25 is then brought into contact with push switch 60, and is fixed to tip knob 24. At that time, switch cover 25 is in contact with push switch 60.

Lastly, fixed knob 21 is attached to sliding member 11. Lever switch device 10 is completed according to the above assembly procedures.

<Actions and Effects>

As shown in FIG. 6, holder 90 is assembled in a direction intersecting with the axial direction of shaft member 30. Therefore, holder 90 is fixed to shaft member 30. As shown in FIG. 1A, push switch 60 is fixed to shaft member 30 in the pressing direction parallel to the axial direction, and is in contact with switch cover 25, which is the push operation part. Therefore, when the user presses switch cover 25 and switch cover 25 moves, movement distance of switch cover 25 conforms to a displacement distance (a positional shift length) of displacement part 61b of push switch 60 pushed and displaced by switch cover 25. The movement distance of switch cover 25 by pressing push switch 60 does not change every time by the push operation. In other words, a relative positional relationship between switch cover 25 and push switch 60 in the pressing direction parallel to the axial direction is constant with respect to shaft member 30. Accordingly, even when displacement (a positional shift) of displacement part 61b in response to the push operation is extremely small, such as about 0.5 mm, the user can press push switch 60 to input by a constant movement distance of switch cover 25. The user can thus operate push switch 60 without any discomfort.

Still more, when holder 90 is fixed to shaft member 30 by, for example, adhesive, an adhesive curing time is required. Conversely, it is enough to fit protruding parts 97 to shaft groove 31 on assembling lever switch device 10. Accordingly, time required for fixing holder 90 onto shaft member 30 is reduced, achieving good workability.

Still more, by disposing push switch 60 on holder 90, lever switch device 10 can employ push switch 60 with the click mechanism. This can make an input timing of push switch 60 close to a timing of giving a click feeling by the click mechanism in response to the push operation. No or small time-lag allows the user to operate push switch 60 without any discomfort.

Still more, a push switch used in a device other than lever switch device 10 in a vehicle can be used as push switch 60 in lever switch device 10. The user can thus operate multiple push switches in the vehicle with the same operation feeling. This eliminates any discomfort due to a difference in the operation feeling among devices, achieving good operability.

Still more, each component is provided with an insertion hole to pass through shaft member 30. Holder 90 and push switch 60 are disposed at second end 30B of shaft member 30. According to the structure, lever switch device 10 can be assembled by stacking the components with respect to shaft member 30. Therefore, operation machines such as robots can be employed to facilitate assembly of lever switch device 10. In addition, there is no need for changing the directions of components. This can suppress any damage to the components, and achieve good workability.

Still more, first wiring part 77 and second wiring part 78 are branched. This enables to provide second board part 72 connected to second wiring part 78 separately from first board part 71 connected to first wiring part 77. Accordingly, first board part 71 and first wiring part 77 can be easily bent to be attached to fixed member 43. Operation machines such as robots can thus be employed for this operation to improve assembly accuracy and prevent contamination by human hands or the like.

Still more, first board part 71 and second board part 72 are formed by FPC 70. This can downsize lever switch device 10 and increase layout flexibility.

Furthermore, lever switch device 10 can be downsized by overlaying first wiring part 77 and second wiring part 78. This also enables to cover first wiring part 77 and second wiring part 78 by one wiring cover 110. Lever switch device 10 can thus be downsized and also a cost increase can be suppressed. Lever switch device 10 can also be downsized and a cost increase can be suppressed by providing third route 49b and fourth route 48b for disposing second wiring part 78 in second board cover 49 and first board cover 48, respectively.

Other Exemplary Embodiment

In the above exemplary embodiment, the pair of protruding parts 97 in holder groove 96 of holder 90 is fitted to shaft grooves 31 of shaft member 30, respectively, so that holder 90 is attached to shaft member 30. However, the attachment method is not limited to this as long as holder 90 is installed to shaft member 30 in a direction intersecting with the axial direction and is attached to second end 30B of shaft member 30.

For example, insertion holes may be provided in both shaft member 30 and holder 90 in a direction intersecting with (e.g., perpendicular to) the axial direction. In this case, holder 90 is placed on second end 30B of shaft member 30, the insertion hole in holder 90 is matched to the insertion hole in shaft member 30, and a bar-like attachment member is passed through these insertion holes. In this structure, the attachment member extends in a direction intersecting with the axial direction of shaft member 30, and holder 90 is attached to second end 30B of shaft member by the attachment member. In this case, the operability for operating push switch 60 via switch cover 25 is also improved.

In the above exemplary embodiment, switch cover 25 is used as the push operation part of push switch 60. However, the push operation part is not limited to switch cover 25. For example, the push operation part may be a knob in contact with push switch 60.

The above exemplary embodiments may be combined as long as they do not interfere with each other. It is apparent that a person skilled in the art will come up with many other modifications or exemplary embodiments of the present disclosure based on the above description. Accordingly, the above description is just illustrative with the intention of providing the best mode of the present disclosure to those skilled in the art. Details of the structure and/or functions can be substantially changed without departing from the concept of the present disclosure.

As described above, lever switch device 10 includes shaft member 30, the rotatory operation member, push switch 60, and FPC 70. Shaft member 30 includes peripheral part 30C, first end 30A, and second end 30B; and extends in the axial direction passing through first end 30A and second end 30B. The rotary operation member is provided outside shaft member 30 at a position between first end 30A and second end 30B of shaft member 30. The rotary operation member is rotatable about shaft member 30, and has the movable contact. The rotary operation member is includes first rotary knob 22, first rotary member 44, and first contact piece 50, for example. Alternatively, the rotary operation member includes second rotary knob 23, second rotary member 46, and second contact piece 51. Push switch 60 is attached to second end 30B of shaft member 30. FPC 70 has multiple wirings transmitting the signal generated in response to displacement (a positional shift) of the rotary operation member and the signal output from push switch 60. These wirings include the first group of wirings 77A and the second group of wirings 78A different from the first group of wirings 77A. FPC 70 includes first board part 71, first wiring part 77, second board part 72, second wiring part 78, and integrated wiring part 79. First board part 71 has fixed contacts 73b and 74b. The movable contact comes into contact with or separates from fixed contacts 73b and 74b in response to the positional shift of the rotary operation member. First wiring part 77 includes the first group of wirings 77A, and is connected to first board part 71. Second board part 72 receives the signal output from push switch 60. Second wiring part 78 includes the second group of wirings 78A, and is connected to second board part 72. In integrated wiring part 79, a part of first wiring part 77 and a part of second wiring part 78 are integrated. Integrated wiring part 79 is located at a position away from first board part 71 and second board part 72.

In this structure, the movable contact rotates together with the rotary operation member, thus the structure is simplified. Still more, since first board part 71 connected to first wiring part 77 and second board part 72 connected to second wiring part 78 are provided separately, these board parts can be bent independently, and thus good workability is achieved.

Second wiring part 78 may face first wiring part 77 by partially bending second wiring part 78. With this structure, a part of first wiring part 77 and a part of second wiring part 78 can be overlaid to downsize lever switch device 10.

Lever switch device 10 may further include fixed member 43, first board cover 48, and second board cover 49. Fixed member 43 is fixed onto shaft member 30, and has end faces supporting first board part 71. First board cover 48 and second board cover 49 support first board part 71 between the end faces of fixed member 43 and them. Third route 49b and fourth route 48b that are part of the wiring route supporting second wiring part 78 may be provided on first board cover 48 and second board cover 49, respectively. This structure can downsize lever switch device 10 because first board cover 48 and second board cover 49 has the wiring route for supporting second wiring part 78 in addition to supporting first board part 71.

As described above, the number of rotary switches 40 may be one. In this case, only one of first board cover 48 and second board cover 49 is needed.

Lever switch device 10 may further include wiring cover 110 for covering first wiring part 77 and second wiring part 78. Lever switch device 10 can be downsized by covering both first wiring part 77 and second wiring part 78 with wiring cover 110.

Lever switch device 10 may further include holder 90 and the push operation part, typically switch cover 25. Holder 90 is installed to shaft member 30 in a direction intersecting with the axial direction, and is attached to second end 30B of shaft member 30. The push operation part is in contact with push switch 60. Push switch 60 is held by holder 90.

In this structure, holder 90 is fixed to shaft member 30 in the axial direction by installing holder 90 in the direction intersecting with the axial direction (crossing direction) of shaft member 30. The push operation part is also in contact with push switch 60 held by holder 90. This establishes a constant relative positional relationship between the push operation part and push switch 60 in the pressing direction parallel to the axial direction. Accordingly, the movement distance of the push operation part for pushing push switch 60 unlikely changes every time the push operation part pushes push switch 60. The user can thus press push switch 60 via the push operation part without any discomfort.

Push switch 60 may be a tactile switch that generates a click feeling in response to the push operation. This structure can make an input timing of push switch 60 close to a timing of giving the click feeling by the click mechanism. Accordingly, the user can use push switch 60 without any discomfort.

Shaft member 30 may be provides with shaft groove 31 extending in the crossing direction in peripheral part 30C, and holder 90 may have protruding part 97 fitted to shaft groove 31 by assembling holder 90 in the crossing direction. For example, when holder 90 is mounted to shaft member 30 with adhesive, time is required for drying the adhesive. Conversely, by fitting protruding part 97 into shaft groove 31, holder 90 can be fixed to shaft member 30 immediately. This achieves good workability.

Lever switch device 10 may further include first click mechanism 45 and second click mechanism for generating a click feeling in response to the rotating operation of the rotary operation member. First click mechanism 45 includes first click face 52, first ball 53, first spring 54, and first housing member 55. First click face 52 is provided thereon with click protrusion 52a protruding in the axial direction toward first end 30A of shaft member 30. First ball 53 is disposed in contact with first click face 52. First spring 54 urges first ball 53 toward first click face 52. First housing member 55 has housing space 55c which houses first ball 53 and first spring 54, extends in the axial direction, and opens toward second end 30B. On the other hand, second click mechanism 47 includes second click face 81, second ball 57, second spring 58, and second housing member 59. Second click face 81 is provided thereon with click protrusion 81b protruding in the axial direction toward first end 30A. Second ball 57 is disposed in contact with second click face 81. Second spring 58 urges second ball 57 toward second click face 81. Second housing member 59 has housing space 59c which houses second ball 57 and second spring 58, extends in the axial direction, and opens toward second end 30B. Each of the rotary operation member, first click face 52, second click face 81, first housing member 55, and second housing member 59 is provided with an insertion hole through which shaft member 30 passes.

This structure facilitates attachment of each component to shaft member 30 by passing shaft member 30 through the insertion holes in the rotary operation part, click faces, and housing members. Still more, the opening of each housing member open toward second end 30B can be faced up by placing second end 30B of shaft member 30 upward. Accordingly, the housing members can be attached to shaft member 30 in the state the balls and springs are housed in the housing spaces, respectively. Still more, holder 90 can be easily mounted to second end 30B of shaft member 30 facing upward.

As described above, the number of rotary switches 40 may be one. In this case, only one of first click mechanism 45 and second click mechanism 47 is required.

The lever switch device of the present disclosure is advantageous as a lever switch device with high workability.

What is claimed is:

1. A lever switch device comprising:
   a shaft member including a peripheral part, a first end, and a second end, the shaft member extending in an axial direction passing through the first end and the second end;
   a rotary operation member provided outside the shaft member at a position between the first end and the second end, the rotary operation member being capable of a rotating operation around the shaft member and having a movable contact;
   a push switch attached to the second end of the shaft member; and
   a flexible board including a plurality of wirings, the plurality of wirings transmitting a signal generated in response to a positional shift of the rotary operation member and a signal output from the push switch,
   wherein the plurality of wirings includes a first group of wirings and a second group of wirings different from the first group of wirings, and
   the flexible board includes:
      a first board part having a fixed contact, the movable contact coming into contact with or separating from the fixed contact in response to the positional shift of the rotary operation member, a first wiring part including the first group of wirings and connected to the first board part, a second board part configured to receive the signal output from the push switch, a second wiring part including the second group of wirings and connected to the second board part, and an integrated wiring part located at a position away from the first board part and the second board part, a part of the first wiring part and a part of the second wiring part being integrated in integrated wiring part.

2. The lever switch device according to claim 1, wherein the second wiring part is partially bent to face the first wiring part.

3. The lever switch device according to claim 1, further comprising:

a fixed member fixed onto the shaft member and having an end face supporting the first board part; and a board cover supporting the first board part disposed between the board cover and the end face of the fixed member, wherein the board cover includes a part of a wiring route supporting the second wiring part.

4. The lever switch device according to claim 1, further comprising a wiring cover covering the first wiring part and the second wiring part.

5. The lever switch device according to claim 1, further comprising:

a holder installed in a crossing direction intersecting with the axial direction relative to the shaft member and attached to the second end of the shaft member; and a push operation part provided in a state in contact with the push switch, wherein the push switch is held by the holder.

6. The lever switch device according to claim 5, wherein the push switch is a tactile switch configured to generate a click feeling corresponding to a push operation.

7. The lever switch device according to claim 5, wherein the shaft member is provide with a groove on the peripheral part, the groove extending in the crossing direction, and the holder has a protruding part that fits to the groove by installing the holder in the crossing direction.

8. The lever switch device according to claim 5, further comprising a click mechanism configured to generate a click feeling in response to the rotating operation of the rotary operation member, wherein the click mechanism includes:

a click face on which a click protrusion is provided, the click protrusion protruding in the axial direction toward the first end, a ball disposed in contact with the click face, a spring urging the ball toward the click face, and a housing member having a housing space, the housing space housing the ball and the spring, extending in the axial direction, and being opened toward the second face, and each of the rotary operation member, the click face, and the housing member is provide with an insertion hole through which the shaft member passes.

* * * * *

UNITED STATES PATENT AND TRADEMARK OFFICE
CERTIFICATE OF CORRECTION

PATENT NO. : 11,361,927 B2
APPLICATION NO. : 16/815247
DATED : June 14, 2022
INVENTOR(S) : Hideki Nishinakama It is certified that error appears in the above-identified patent and that said Letters Patent is hereby corrected as shown below:

On the Title Page

Please DELETE:
"(30) Foreign Application Priority Data
Dec. 8, 2017 (JP).........................JP2017-235935"; and ADD:
-- (30) Foreign Application Priority Data
Dec. 8, 2017 (JP).........................JP2017-235935
Dec. 8, 2017 (JP).........................JP2017-235936 --

Signed and Sealed this
Twenty-first Day of March, 2023

Katherine Kelly Vidal
*Director of the United States Patent and Trademark Office*